(12) United States Patent
Komiya

(10) Patent No.: US 6,653,996 B2
(45) Date of Patent: Nov. 25, 2003

(54) DISPLAY DEVICE

(75) Inventor: Naoaki Komiya, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 465 days.

(21) Appl. No.: 09/819,880

(22) Filed: Mar. 28, 2001

(65) Prior Publication Data

US 2002/0011973 A1 Jan. 31, 2002

(30) Foreign Application Priority Data

Mar. 28, 2000 (JP) ........................................ 2000-088213

(51) Int. Cl.$^7$ ................................................. G09G 3/30
(52) U.S. Cl. .............................. 345/76; 345/77; 345/82; 345/83; 345/92; 345/204; 345/211; 345/212; 345/213; 345/214; 315/169.3; 713/330
(58) Field of Search ............................. 345/76, 82, 83, 345/211, 212, 77, 204, 214, 92; 713/324, 330, 340; 315/169.3

(56) References Cited

U.S. PATENT DOCUMENTS

| | | | | |
|---|---|---|---|---|
| 4,528,480 A | * | 7/1985 | Unagami et al. | 315/169.1 |
| 5,952,789 A | | 9/1999 | Stewart et al. | 315/169.4 |
| 6,011,529 A | | 1/2000 | Ikeda | 345/77 |
| 6,034,659 A | | 3/2000 | Wald et al. | 345/76 |
| 6,307,324 B1 | * | 10/2001 | Hirano et al. | 315/169.3 |
| 6,356,032 B1 | * | 3/2002 | Suzuki et al. | 315/169.3 |
| 6,456,013 B1 | * | 9/2002 | Komiya et al. | 315/169.1 |

* cited by examiner

Primary Examiner—Richard Hjerpe
Assistant Examiner—Ali Zamani
(74) Attorney, Agent, or Firm—Cantor Colburn LLP

(57) ABSTRACT

In a display device including, for each pixel, an organic EL element (60) and TFTs (30, 40) for controlling the element, a sequential circuit (350) is provided for stopping supply of power source voltages Vvdd and Hvdd to drivers (80, 90) for driving the TFTs (30, 40) which control each organic EL element (60) after stopping supply of power source voltage Pvdd to the organic EL element (60) when the device is turned off.

6 Claims, 4 Drawing Sheets

DISPLAY DEVICE

BACKGROUND OF THE INVENTION

1. Field of the Invention

The present invention relates to a display device comprising a thin film transistor (hereinafter referred to as a "TFT") for controlling a current to be supplied to a light emissive element.

2. Description of the Related Arts

In recent years, electroluminescence (hereinafter referred to as "EL") display devices using an EL element have been attracting attention as possible replacements for CRTs and LCDs.

In addition, an EL display device provided with a thin film transistor functioning as a switching element for driving the EL element has been researched and developed.

FIG. 1 is an equivalent circuit diagram of an EL display device according to a related art.

Referring to FIG. 1, an EL display panel includes, on an insulating substrate 10, a plurality of scan signal lines 81 connected to a vertical driver 80 for supplying a scan signal, and a plurality of data lines 91 receiving a data signal Sig on a data input line 92 when sampling transistors SP1, . . . , SPk, SPk+1, . . . , SPn are turned on in accordance with the timing of a sampling pulse output from a horizontal driver 90 for supplying the data signal. Near each intersection between these lines 81 and 91, a switching TFT 30 connected to these lines 81 and 91, an element driving TFT 40 connected to the switching TFT 30, and an organic EL element 60 for emitting light by receiving a current from an element driving power source line 100 in accordance with a voltage applied to a gate of the element driving TFT 40 are disposed.

A storage capacitor 70 is provided between the TFTs 30 and 40, having one electrode 71 connected to a source 11s of the TFT 30, and the other electrode 72 receiving a potential common to all display pixels 200.

The horizontal driver 90 receives a timing signal and the like, such as a horizontal start pulse STH, while the vertical driver 80 receives a timing signal and the like, such as a vertical start pulse.

The drivers 80 and 90 also receive driving voltages Vvdd and Hvdd, respectively, for driving these drivers. Each of the driving voltages Hvdd and Vvdd drives a shift register forming one of the drivers.

The sampling pulses are sequentially output from the horizontal driver 90 based on the start signal, and the sampling transistors SP are turned on in response to the sampling pulse, whereby a data signal Vdata1 on the data input line 92 is supplied to the data signal line 91. A gate signal is applied from the gate signal line 81 to a gate 13 of the first TFT 30, thereby turning on the first TFT 30. As a result, a drain signal is supplied to a source 11s of the TFT 30, and a voltage Vdata2 obtained at this point in time is applied to a gate 43 of the second TFT 40, thereby turning on the second TFT 40 and causing a current to flow from the element driving power source line 100 to the EL element 60 in accordance with a gate voltage Vdata2, such that light is emitted from the EL element 60.

A power source circuit 300 for generating the driving voltages Vvdd and Hvdd for driving the drivers 80 and 90, and an element driving power source Pvdd shown in FIG. 1 will next be described.

FIG. 2 is a block diagram of the power source circuit according to a related art.

Referring to FIG. 2, the power source circuit 300 includes a driver driving voltage generation circuit 320 for generating the driving voltages Hvdd and Vvdd for driving the drivers 80 and 90, and an element driving voltage generation circuit 330 for generating the element driving voltage Pvdd. The driving voltage generation circuits 320 and 330 are each formed by a DC/DC converter for converting a voltage of a power source 310, say, converting a voltage of 15V to a voltage of 12V.

The voltages of the driving voltage generation circuits 320 and 330 are provided to the drivers 80 and 90 and the element driving power source line 100.

In conventional EL display devices, however, when the display device is turned off after use, within the power source circuit 300, the flow of power is only suspended to the power source 310 and the circuits 320 and 330. When the voltage Vdata2 applied to the gate of the second TFT 40 falls before the element driving voltage Pvdd, a large amount of current may instantly flow to the EL element 60 from the power source line 100, even though control by the second TFT 40 is not possible. When this occurs, degradation of an emissive layer 66 of the organic EL element 60 may result.

SUMMARY OF THE INVENTION

The present invention has been conceived in view of the above-described problems, and an object thereof is to provide a display device capable of preventing degradation of an emissive layer as would otherwise be caused by excessive and instantaneous emission of light from an EL element when the display device is turned off.

According to one aspect of the present invention, a display device includes a vertical driver for supplying a scan signal to a plurality of gate signal lines; a horizontal driver for supplying a data signal to a plurality of data signal lines crossing said plurality of gate signal lines; a switching element connected to the gate signal line and the data signal line at an intersection between these signal lines; an emissive element connected to said switching element; an element driving power source line for supplying electric power to said emissive element; and a sequence circuit for stopping supply of electric power to said element driving power source line before stopping supply of a driver driving power source.

According to another aspect of the present invention, the switching element is composed of first and second thin film transistors, the first thin film transistor has a first region of an active layer connected to said data signal line, a gate connected to said scan signal line, and a second region of the active layer connected to a gate of the second thin film transistor, and the second thin film transistor has a first region of an active layer connected to said element driving power source line, and a second region of the active layer connected to one electrode of said emissive element.

According to a further aspect of the present invention, the sequence circuit includes first and second transistors; first and second resistors; and a third resistor connecting said first and second transistors, said first transistor has an emitter connected to said first resistor which is connected to an element driving power source generation circuit, a base connected to a power source, and a collector connected to ground, and said second transistor has an emitter connected to said second resistor which is connected to a driver driving power source generation circuit, a base connected to said third resistor, which is connected to the emitter of said first transistor, and to the other electrode of a capacitor whose one electrode is connected to ground, and a collector connected to ground.

According to a further aspect of the present invention, the emissive element is an electroluminescence element.

With the present invention, a display device capable of preventing degradation of an emissive element which would otherwise be caused by a large amount of current instantly flowing to the emissive element when the display device is turned off can be provided.

DESCRIPTION OF THE PREFERRED EMBODIMENTS

A display device of the present invention will next be described.

Figure 3:
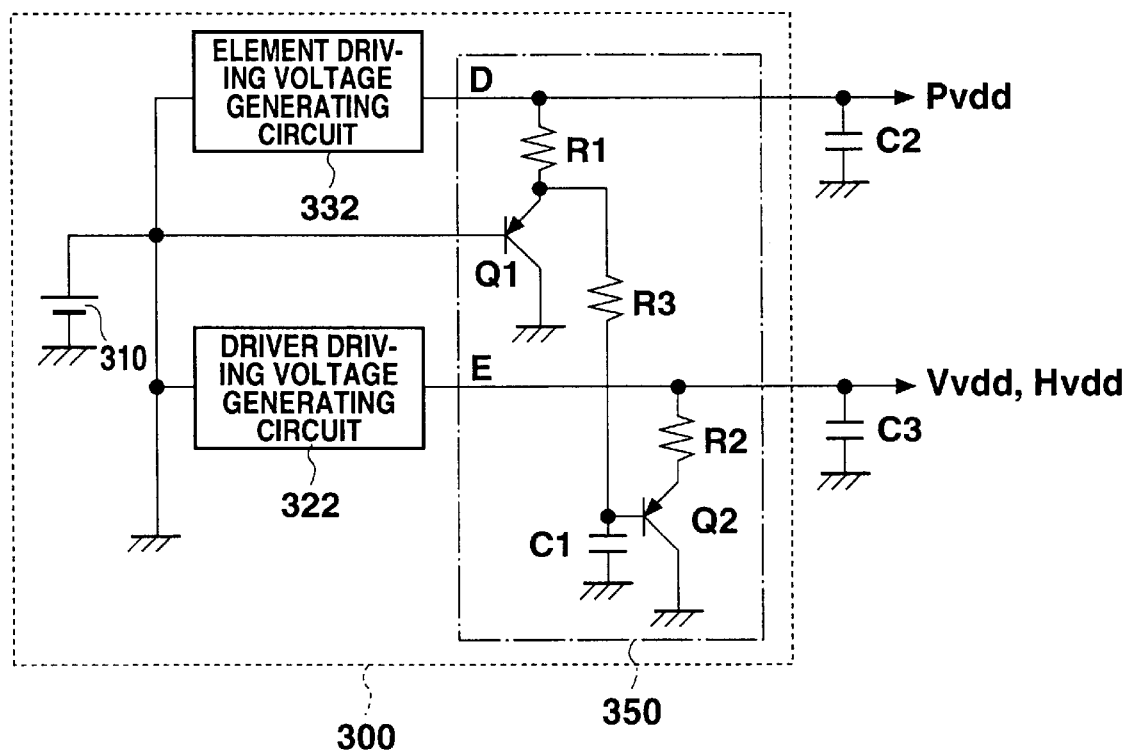
FIG. 3 is a diagram of a driving circuit of a display device according to the present invention.

FIG. 3 illustrates a configuration of a power source circuit of the display device according to the present invention.

Referring to FIG. 3, a power source circuit 300 includes a driver driving voltage generation circuit 322 connected to a power source 310 and generating a voltage for driving a vertical driver 80 and a horizontal driver 90, an element driving voltage generation circuit 332 connected to the power source 310 and driving an emissive element, and a sequential circuit 350.

The sequential circuit 350 includes first and second transistors Q1 and Q2, resistors R1, R2, and R3, and a capacitor C1. The first and second transistors Q1 and Q2 are, in this example, both PNP transistors.

The first transistor Q1 has an emitter connected to the first resistor R1 which is connected to the element driving power source generation circuit 332, a base connected to the power source 310, and a collector connected to ground.

The second transistor Q2 has an emitter connected to the second resistor R2 which is connected to the driver driving voltage generation circuit 322 for driving the horizontal and vertical drivers, a base connected to the emitter of the first transistor Q1 through the third resistor R3 and to the capacitor C1 provided between the transistor Q2 and the ground, and a collector connected to ground.

Figure 1:
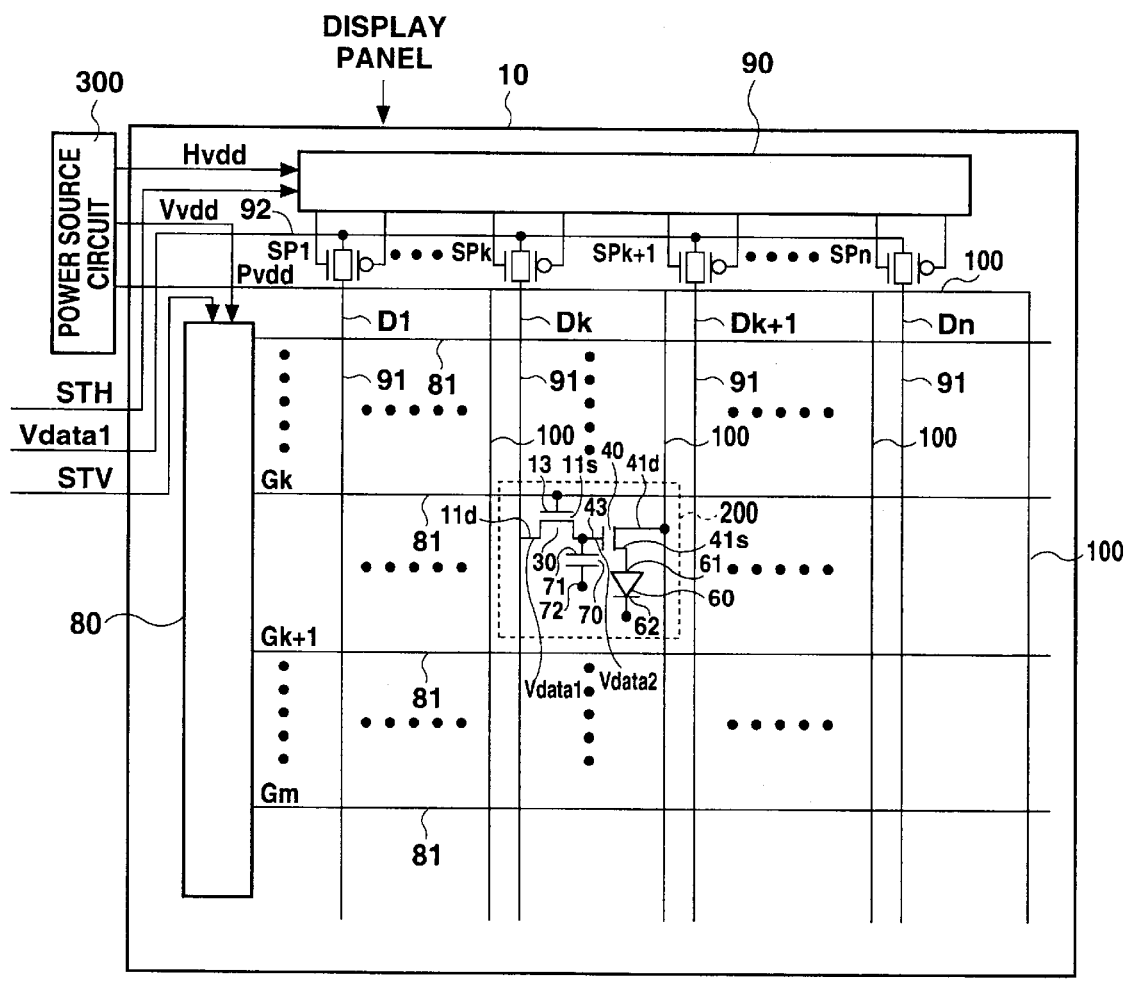
FIG. 1 is a circuit diagram of an EL display device.
Figure 2:
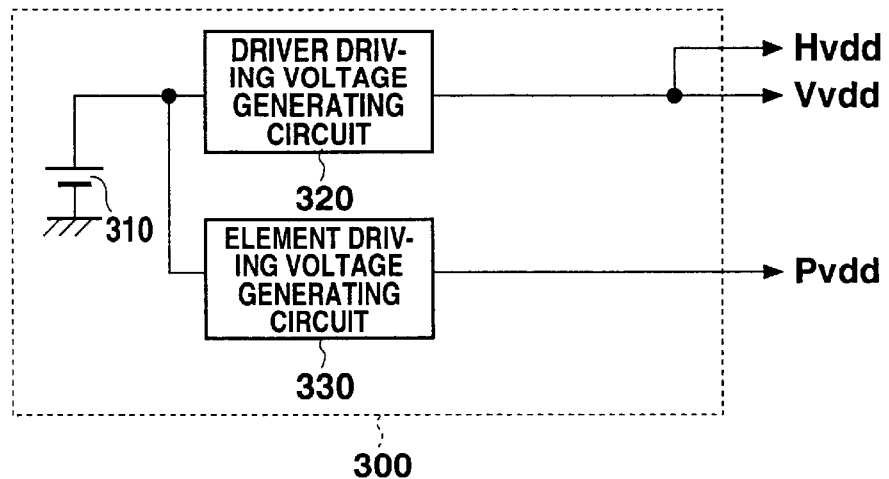
FIG. 2 illustrates a configuration of a power source circuit of a display device according to a related art.

When the display device is turned on and the voltage is supplied to the display device from the power source, the voltages Vvdd and Hvdd are supplied from the power source circuit 300 shown in FIG. 3 to the drivers 80 and 90 described in connection with FIG. 1, thereby driving the drivers 80 and 90 and applying the voltage Pvdd for driving the element to the element driving power source line 100. For example, the voltage of the power source 310 may be 20V, the driver driving voltages Hvdd and Vvdd, 15V, and the element driving voltage Pvdd, 12V.

The drivers 80 and 90 driven in the above-described manner receive signals required to present a display, such as start pulses STH, STV, and the like.

The sampling transistors SP1, . . . , Spk, SPk+1, . . . , Spn are sequentially turned on in accordance with the sampling pulse based on the start pulse STH, whereby the data signal Vdata1 on the data input line 92 is supplied to e ch of the data signal lines 91. Meanwhile, a gate signal is supplied from the ate signal line 81 to the gate 13 of the first TFT 30 based on the start pulse STV, thereby turning on the first TFT 30. As a result, the data signal is supplied to the source 11s of the TFT 30, and the voltage Vdata2 obtained at this point in time is applied to the gate 43 of the second TFT 40, thereby turning on the gate of the second TFT 40, causing a current at the element driving power source line 100 to flow into the EL element 60 in accordance with the voltage Vdata2, so that light is emitted from the EL element 60.

Operation of the power source circuit 300 when the display device is turned on will next be described with reference to FIG. 3.

When the device is turned on, the power source 310 is first switched on, and the generated power source voltage is supplied to the element driving voltage generation circuit 332, the driver driving voltage generation circuit 322, and the base of the first transistor Q1.

When the voltage is thus supplied to the element driving voltage generation circuit 332, the element driving voltage Pvdd is generated and supplied to the element driving power source line 100.

Meanwhile, when the voltage is thus supplied to the driver driving voltage generation circuit 322, the driver driving voltages Vvdd and Hvdd are generated and supplied to the drivers 80 and 90.

The first transistor Q1 will not be turned on when the power source 310 is turned on because it is a PNP transistor as described above.

Therefore, when the power source 310 is turned on, the element driving voltage Pvdd is supplied to the element driving power source line 100 from the element driving voltage generation circuit 332, and the driver driving voltages Vvdd and Hvdd are generated by the driver driving voltage generation circuit 322, and supplied to the drivers 80 and 90.

Operation of the power source circuit 300 when the display device is turned off will next be described with reference to FIG. 3.

When the device is turned off, the power source 310 is first switched off, and the element driving voltage generation circuit 332 and the driver driving voltage generation circuit 322 are turned off.

When the power source 310 is switched off, the base of the first transistor Q1 assumes a "Low" voltage and the first transistor Q1 is turned on. As a result, the current applied to the element driving power source line 100 in accordance with the element driving voltage Pvdd flows to ground through the resistor R1 and the emitter and the collector of the first transistor Q1. The timing after the operation of the transistor Q1 at which the element driving power source voltage Pvdd is decreased may be controlled to as desired by adjusting a time constant determined by the resistor R1 and a capacitor C2.

When the first transistor Q1 is turned on by turning off the power source 310, the emitter potential of the transistor Q1 is decreased, and a "Low" potential is applied to the base of the second transistor Q2 connected to this emitter through the resistor R3, thereby turning on the second transistor Q2. As a result, a current flows to ground from the power source line for supplying the power source voltages Vvdd and Hvdd to the drivers 80 and 90 through the resistor R2 and the emitter and collector of the second transistor Q2. The timing after the operation of the transistor Q2 at which the driver power source voltages Vvdd and Hvdd is decreased may be controlled to as desired by adjusting a time constant determined by the resistor R2 and a capacitor C3.

Thus, when the power source 310 is switched off, first the first transistor Q1 and then the second transistor Q2 are turned on. More specifically, by first turning on the first transistor Q1, the electric charge applied to the element driving power source line 100 flows to ground through the first transistor Q1. When a period as determined by the resistor R3, the capacitor C1, or the like has elapsed after the first transistor Q1 is turned on, the second transistor is turned on and the electric charge applied to the drivers 80 and 90 flows to ground through the second transistor Q2.

Thus, supply of the element driving voltage Pvdd is first halted, and thereafter supply of the driver driving voltages Hvdd and Vvdd is stopped. Therefore, supply of the voltage to the element driving power source line 100 can be stopped before stopping application of the voltage to the gate 43 of the second TFT 40.

Figure 4:
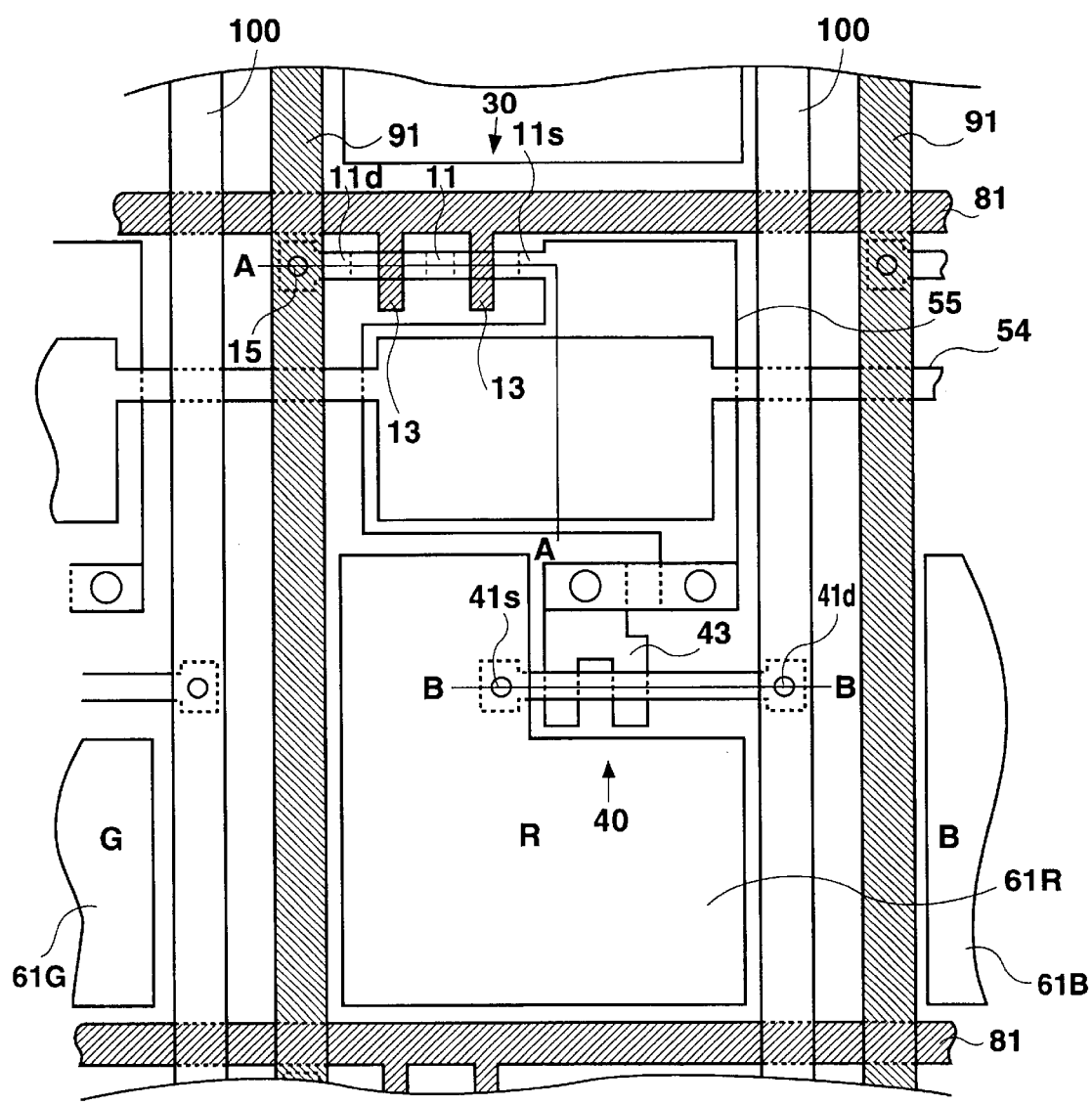
FIG. 4 schematically illustrates a planar structure of a display pixel portion of an EL display device according to the present invention.
Figure 5A:
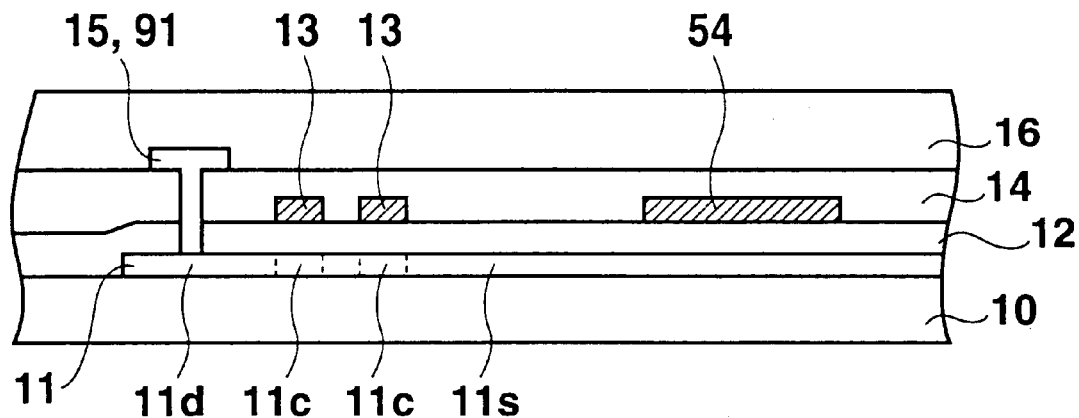
FIG. 5A is a cross-sectional view of the EL display device taken along the line A—A in FIG. 4.
Figure 5B:
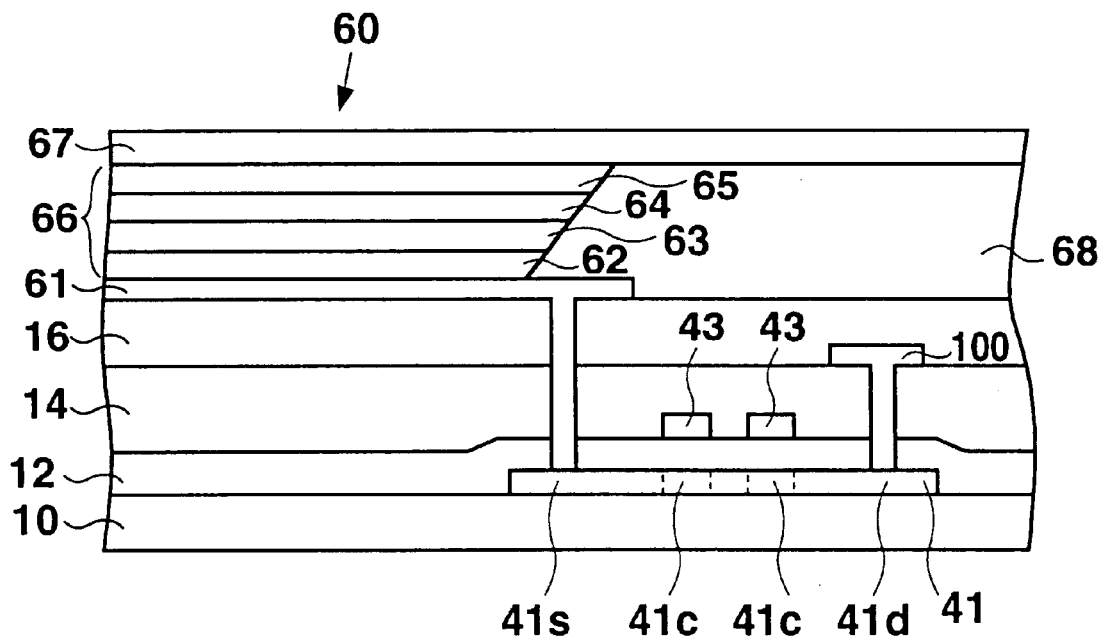
FIG. 5B is a cross-sectional view of the EL display device taken along the line B—B in FIG. 4.

An organic EL display device provided with TFTs for switching and driving the element will be described. FIG. 4 is a plan view illustrating a portion near a display pixel, FIG. 5A is a cross sectional view taken along the line A—A in FIG. 4, and FIG. 5B is a cross sectional view taken along the line B—B in FIG. 4. Components common to the respective figures are labeled with the same reference characters and numerals.

Referring to FIG. 4, the display pixel is formed in a region surrounded by the gate signal lines 81 and the data lines 91. Near an intersection between these lines, the first TFT 30 for switching is disposed. The source 11s of the TFT 30 functions as a capacitor electrode 55 forming a capacitor with a storage capacitor electrode line 54 described below, and is connected to the gate 43 of the second TFT 40 for driving the EL element. The second TFT has a source 41s connected to an anode 61R of the organic EL element 60 and a drain 41d connected to the driving power source line 100 which functions as a current source for supplying a current to the organic EL element 60.

A storage capacitor electrode line 54 is disposed near the TFTs in parallel to the gate signal line 81. The storage capacitor electrode line 54 is formed of chromium or the like, and forms a capacitor with the capacitor electrode 55 connected to the source 11s of the TFT 30 through a gate insulating film 12 to store electric charges. The storage capacitor is provided for holding the voltage applied to the gate voltage 43 of the second TFT 40.

Referring to FIG. 5A and FIG. 5B, the organic EL display device is formed by providing the TFTs and the organic EL element stacked in a proper order on a substrate 10 formed of a material such as glass or synthetic resin, or of a conductive or semiconductor material.

The first TFT 30 functioning as a switching TFT will first be described.

As shown in FIG. 5A, on an insulating substrate 10 formed of quartz glass, non-alkaline glass, or the like, a non-amorphous silicon film (a-Si film) is formed through CVD or the like and irradiated with laser beams to form a polycrystalline silicon film (p-Si film) 11 functioning as an active layer. The gate insulating film 12 is disposed on the p-Si film 11. On this film are formed the element driving power source line 100, the storage capacitor line 54, and the scan signal line 81 functioning as a gate electrode 13 formed of a refractory metal, such as chromium (Cr), molybdenum (Mo), or the like.

On the gate insulating film 12, over its entire surface, are layered the gate electrode 13, the element driving power source line 100, and the storage capacitor electrode line 54, an interlayer insulating film 14 composed of an $SiO_2$ film, an SiN film, and an $SiO_2$ film, in that order. A drain electrode 15 formed by filling a metal, such as Al, in a contact hole provided corresponding to the drain 11d, is disposed. The data line 91 functions as the drain electrode 15. Further, a planarization insulating film 16 is formed of an organic resin over the entire surface for planarizing the surface.

The second TFT 40 used for driving the organic EL element will next be described.

As shown in FIG. 5B, on the substrate 10 are formed an active layer 41 of a p-si film formed simultaneously with the active layer of the first TFT 30, the gate insulating film 12, and the gate electrode 43 of a refractory metal such as Cr or Mo, in that order. At the active layer 41, a channel 41c is provided, and a source 41s and the drain 41d are formed on both sides of the channel 41c. The interlayer insulating film 14 composed of an $SiO_2$ film, an SiN film, and an $SiO_2$ film, stacked in that order, is formed over the entire surface including the active layer 41 and the gate insulating film 12. The element driving power source line 100 is disposed connected to the driving power source (Pvdd) by filling a metal, such as Al, in a contact hole provided corresponding to the drain 41d. The planarization insulating film 16 is further provided over the entire surface. A contact hole is formed at a position of the planarization insulating film 16 corresponding to the source 41s. A transparent electrode of ITO (indium tin oxide), i.e. the anode 61 of the organic EL element, is formed on the planarization insulating film 16, making a contact with the source 41s through this contact hole.

The organic EL element 60 includes the anode 61 formed of a transparent electrode, such as ITO, an emissive element layer 66 described below, and a cathode 67 formed of magnesium-indium alloy, or the like, stacked in that order. The emissive element layer 66 may include, for example, a first hole transport layer 62 formed of MTDATA(4,4,4-tris (3-methylphenylphenylamino) triphenylamine), a second hole transport layer 63 of TPD (N, N-diphenyl-N, N-di(3-methylphenyl)-1,1-biphenyl-4,4-diamine), an emissive layer 64 of Bebq$_2$ (bis(10-hydroxybenzo[h]quinolinato) beryllium) including quinacridone derivatives, and an electron transport layer 65 of Bebq$_2$ or the like. It should be noted that an insulating layer 68 is formed for preventing a short circuit between an edge of the anode 61 and the cathode 67. The organic EL element 60 has an exemplary configuration as described above, and this element 60 substantially forms the display pixel (emissive region).

In the organic EL element, holes and electrons injected from the anode and the cathode, respectively, are recombined in the emissive layer, thereby exciting organic molecules contained in the emissive layer and generating excitons. Light is released from the emissive layer during the process in which the excitons deactivate, and this release of light from the transparent anode through the transparent insulating substrate and to the outside can be observed.

According to the preferred embodiment of the present invention, in the display device having the organic EL element 60 as described above, the element driving power source voltage Pvdd for supplying a current to the EL element 60 through the second TFT 40 is first controlled to be turned off when the device is turned off. Accordingly, the current to flow through each organic EL element 60 is first stopped while the second TFT 40 is ON, and then the driver power source is turned off, thereby turning off the first and second TFTs 30 and 40.

By turning off the display device in the above-described order, the flowing of a large current to the organic EL element 60, especially to the emissive element layer 66, when the device is turned off can be prevented, thereby preventing degradation of the emissive element layer 66, and, therefore, of the organic EL element 60.

While in the above description the timing for starting the supply of the power source voltages Vvdd and Hvdd to the drivers is substantially the same as the timing for starting the supply of the power source voltage Pvdd to the element driving power source line when the device is turned on, the present invention is not limited to such a configuration, and the sequence circuit 350 may provide the power source voltage Pvdd to the element driving power source line after first supplying the power source voltages to the drivers.

What is claimed is:

1. A display device, comprising:
   a vertical driver for supplying a scan signal to a plurality of gate signal lines;
   a horizontal driver for supplying a data signal to a plurality of data signal lines crossing said plurality of gate signal lines;
   a switching element connected to the gate signal line and the data signal line at an intersection between these signal lines;
   an emissive element connected to said switching element;
   an element driving power source line for supplying electric power to said emissive element; and
   a sequence circuit for stopping supply of electric power to said element driving power source line before stopping supply of a driver driving power source.

2. The display device according to claim 1, wherein said sequence circuit includes first and second transistors, first and second resistors, and a third resistor connecting said first and second transistors; said first transistor has an emitter connected to said first resistor which is connected to an element driving power source generation circuit, a base connected to a power source, and a collector connected to ground; and said second transistor has an emitter connected to said second resistor which is connected to a driver driving power source generation circuit, a base connected to said third resistor, which is connected to the emitter of said first transistor, and to the other electrode of a capacitor whose one electrode is connected to ground, and a collector connected to ground.

3. The display device according claim 1, wherein said emissive element is an electroluminescence element.

4. A display device, comprising:
   a vertical driver for supplying a scan signal to a plurality of gate signal lines;
   a horizontal driver for supplying a data signal to a plurality of data signal lines crossing said plurality of gate signal lines;
   an emissive element;
   an element driving power source line for supplying power to said emissive element;
   a switching element disposed between the gate and data signal lines and a corresponding emissive element in proximity of an intersection between these signal lines, said switching element having a first thin film transistor and a second thin film transistor, the first thin film transistor having a first region of an active layer connected to said data signal line, a gate connected to said gate signal line, and a second region of the active layer connected to a gate of the second thin film transistor, and the second thin film transistor having a first region of an active layer connected to said element driving power source line, and a second region of the active layer connected to one electrode of said emissive element; and
   a sequence circuit for stopping supply of electric power to said element driving power source line before stopping supply of a driver driving power source.

5. The display device according to claim 4, wherein said sequence circuit includes first and second transistors, first and second resistors, and a third resistor connecting said first and second transistors; said first transistor has an emitter connected to said first resistor which is connected to an element driving power source generation circuit, a base connected to a power source, and a collector connected to ground; and said second transistor has an emitter connected to said second resistor which is connected to a driver driving power source generation circuit, a base connected to said third resistor, which is connected to the emitter of said first transistor, and to the other electrode of a capacitor whose one electrode is connected to ground, and a collector connected to ground.

6. The display device according claim 4, wherein said emissive element is an electroluminescence element.

* * * * *